US008529984B2

(12) United States Patent
Lewis

(10) Patent No.: US 8,529,984 B2
(45) Date of Patent: Sep. 10, 2013

(54) METHOD OF PRODUCING AN OMBRÉ FINISH FOR MATERIALS

(76) Inventor: Sally Sirkin Lewis, Beverly Hills, CA (US)

( * ) Notice: Subject to any disclaimer, the term of this patent is extended or adjusted under 35 U.S.C. 154(b) by 0 days.

(21) Appl. No.: 13/190,291

(22) Filed: Jul. 25, 2011

(65) Prior Publication Data

US 2012/0021121 A1 Jan. 26, 2012

Related U.S. Application Data

(60) Provisional application No. 61/367,771, filed on Jul. 26, 2010.

(51) Int. Cl.
*C23C 16/52* (2006.01)

(52) U.S. Cl.
USPC ............... 427/8; 427/258; 427/261; 427/262; 427/265; 427/267; 427/280; 427/287; 427/288; 427/290; 427/291; 427/421.1

(58) Field of Classification Search
USPC .............. 427/421.1, 258, 261, 262, 265, 267, 427/280, 287, 288, 8, 290, 291
See application file for complete search history.

(56) References Cited

U.S. PATENT DOCUMENTS

| | | | | |
|---|---|---|---|---|
| 1,758,234 | A * | 5/1930 | Mijer | 8/149.3 |
| 1,773,169 | A | 8/1930 | Cadgene | |
| 1,874,320 | A | 8/1932 | Lipari | |
| 1,902,522 | A | 3/1933 | Rose | |
| 2,055,658 | A | 9/1936 | Grison | |
| 2,096,400 | A * | 10/1937 | Kritchevsky | 8/111 |
| 2,106,794 | A | 2/1938 | Cobb | |
| 2,716,585 | A | 8/1955 | Bailey | |
| 2,772,137 | A * | 11/1956 | Weber | 8/402 |
| 3,389,045 | A | 6/1968 | Jones et al. | |
| 3,692,557 | A | 9/1972 | Sormani | |
| 3,808,843 | A | 5/1974 | Blore et al. | |
| 4,317,847 | A | 3/1982 | Batistelli | |

(Continued)

FOREIGN PATENT DOCUMENTS

| | | |
|---|---|---|
| EP | 2133215 | 12/2009 |
| EP | 2412449 A1 | 2/2012 |
| GB | 463589 | 4/1937 |
| WO | WO 00/15400 | 3/2000 |

OTHER PUBLICATIONS

Search Report in corresponding European Patent App. No. 11175470.1 dated Nov. 30, 2011.

*Primary Examiner* — Timothy Meeks
*Assistant Examiner* — Nathan T Leong
(74) *Attorney, Agent, or Firm* — Cox Smith Matthews Incorporated

(57) ABSTRACT

Methods of producing an ombré finish for materials may comprise applying a stain to the surface of a material in a first concentration toward a first part of said surface and in a second concentration toward a second part of said surface, blending said stain from said first part to said second part to create a gradual transition in concentration, and sealing said surface. Said methods may also comprise applying a stain substantially uniformly to the surface of a material, removing said stain from said surface so as to create a gradual transition in concentration of said stain, and sealing said surface. Said methods may further comprise the steps of comparing the color of said material to a target color and toning said material until said color of said material matches said target color.

19 Claims, 2 Drawing Sheets

(56) References Cited

U.S. PATENT DOCUMENTS

2004/0166287 A1* 8/2004 Dresser ........................ 428/151
2006/0000173 A1* 1/2006 Edstrom ........................ 52/313
2008/0090009 A1 4/2008 Xu
2010/0034977 A1 2/2010 Kim et al.

* cited by examiner

METHOD OF PRODUCING AN OMBRÉ FINISH FOR MATERIALS

CROSS-REFERENCE TO RELATED APPLICATIONS

This application claims priority to U.S. Provisional Patent Application No. 61/367,771 filed on Jul. 26, 2010.

BACKGROUND

The term ombré may be used to describe a visual effect by which a color is graduated from dark at one portion, such as the bottom or side, of a surface or material to progressively lighter at another portion, such as the top or center, of a surface or material. The actual graduation may be from a darker color to a lighter color or shade, or to any combination of colors or shades. For example, an ombré effect may be formed in a textile by selectively dyeing the material. Similarly, through the careful selection of yarns and particular knitting patterns, ombré effects may be produced in fabrics using pre-colored threads. Ombré effects have also been applied to blended thermoplastic polymers through the selective extrusion of plastics having different colors, which may be used for decorative purposes. However, while ombré effects have been used on textile threadings and extruded plastics, they have not been adapted for use in connection with stain finishes. Stain finished may be applied to any material adapted for receiving stain and may be used in connection with large surfaces or surfaces having irregular patters or shapes.

The term "Material" as used herein means any material adapted for receiving stain, and may include, by way of nonlimiting example, fibrous materials derived from wood, solid woods, hardwoods, veneers, particle board, plywood, medium-density fiberboard, polymers, resins, and plastics. A veneer may comprise thin slices of wood, usually thinner than about 3 mm (⅛ inch), that are obtained by slicing large rectangular blocks of hardwood known as flitches. Veneer may be raw, having no backing material, or may be backed by a binding substrate such as paper. Additionally, multiple veneers may be laid up, or joined together to form larger pieces. Veneers may be laid up in various patterns such as, by way of nonlimiting example, book matched, i.e., where veneers are opened from the flitch much like pages from a book, slip matched, i.e., where veneers are joined together in the order they come from the flitch, radial matched, i.e., where veneers are cut into wedge shaped pieces and joined together, and diamond matched, i.e., where veneers are patterned to form various patterns. Veneers may be derived from any type of wood including, by way of nonlimiting example, cherry, maple, French ash, sycamore, birdseye maple, oak, ribbon stripe mahogany, wenge, and walnut.

Materials may be treated in a variety of ways, such as by way of staining Before applying stain to a material, the material may first be prepared to receive stain through bleaching. A bleach is a chemical that removes or lightens colors, often via oxidation. Common chemical bleaches may include, by way of nonlimiting example, chlorine bleach, a solution of about 3-6% sodium hypochlorite (NaClO), and oxygen bleach, which contains hydrogen peroxide or a peroxide-releasing compound such as sodium perborate, sodium percarbonate, sodium persulfate, tetrasodium pyrophosphate, or urea peroxide together with catalysts and activators, e.g., tetraacetylethylenediamine and/or sodium nonanoyloxybenzenesulfonate. Two-part oxygen bleaches may be used in the whitening of, for example, wood materials. The bleaching time of a material may be decreased by exposure to direct sunlight.

A wood stain may comprise a colorant suspended or dissolved in solvent. The solvent may be, by way of nonlimiting example, water, alcohol, or petroleum distillate. Two types of colorants may be used, namely, pigments and dyes. Dyes may be microscopic crystals that dissolve in solution, while pigments may be much larger particles that remain suspended in solution. Fine-grained woods, such as cherry or maple, may be colored by dyes, but pigments may be too large to attach to the small pores of such woods. Some wood stains may contain binding agents which allow pigments to bind to even fine-grained woods. Typically, pigments will not give much color to fine-grained woods, but will deeply color woods with large pores, such as, for example, oak. Most commercial wood stains contain both dye and pigment and the degree to which they stain wood is mostly dependant on the length of time they are left on the wood.

Varnish may be a transparent, hard, protective finish or film and may be used to seal the surface of a material. Varnish may be a combination of a drying oil, a resin, and a thinner or solvent. While varnish may be glossy in appearance, it may also be designed to produce satin or semi-gloss sheens by the addition of flatting agents. Varnish may have little or no color, be transparent, and have no added pigment. After application, the film-forming substances in varnish either may harden directly, as soon as the solvent has fully evaporated, or may harden after evaporation of the solvent through certain curing processes, primarily chemical reactions between oils and oxygen from the air and chemical reactions between components of the varnish.

For example, resin varnishes may dry by evaporation of the solvent and may harden almost immediately upon drying, while acrylic and waterborne varnishes may dry upon evaporation of the solvent but may experience an extended curing period. Oil, polyurethane, and epoxy varnishes may remain liquid even after evaporation of the solvent but quickly begin to cure, undergoing successive stages from liquid, to "sticky," to "dry to the touch," to hard. Environmental factors such as heat and humidity may play a large role in the drying and curing times of varnishes. The drying and curing time of all varnishes may be decreased by exposure to an energy source such as sunlight, ultraviolet light, or heat.

A lacquer may be a quick-drying, solvent-based varnish, which may include a thinning agent such as, by way of nonlimiting example, butyl acetate, xylene or toluene. Examples of lacquer may include, for purposes of illustration, nitrocellulose lacquers, acrylic lacquers, and water-based lacquers.

Materials may also be treated by sanding the material to make the surface uniform. Sanding may occur by hand or through use of a mechanized sander, such as an orbital or vibrating sander. Sandpaper may be a form of paper where an abrasive material has been fixed to the surface of the paper. Sandpaper may be used to remove material from surfaces, either to make the surface smoother, to remove a layer of material, or sometimes to make the surface rougher. Grit size refers to the size of the particles of abrading materials embedded in the sandpaper. A number of different standards have been developed for grit sizes, which establish the average grit size and the allowable variation from the average. The two most common are the United States CAMI (Coated Abrasive Manufacturers Institute) and the European FEPA (Federation of European Producers of Abrasives) "P" grade, which is identical to the ISO 6344 standard.

SUMMARY

Methods of producing an ombré finish for materials may comprise applying a stain to the surface of a material in a first concentration toward a first part of said surface and in a second concentration toward a second part of said surface, blending said stain from said first part to said second part to create a gradual transition in concentration, and sealing said surface. Said methods may also comprise applying a stain substantially uniformly to the surface of a material, removing said stain from said surface so as to create a gradual transition in concentration of said stain, and sealing said surface. Said methods may further comprise the steps of comparing the color of said material to a target color and toning said material until said color of said material matches said target color.

DETAILED DESCRIPTION

As used herein, the following terms should be understood to have the indicated meanings:

When an item is introduced by "a" or "an," it should be understood to mean one or more of that item.

The terms "first," "second," and the like as used herein do not denote any order, quantity, or importance, but rather are used to distinguish one element from another.

"Comprises" means includes but is not limited to.

"Comprising" means including but not limited to.

"Having" means including but not limited to.

"Including" means including but not limited to.

The endpoints of all ranges directed to the same component or property are inclusive and independently combinable.

Figure 1:
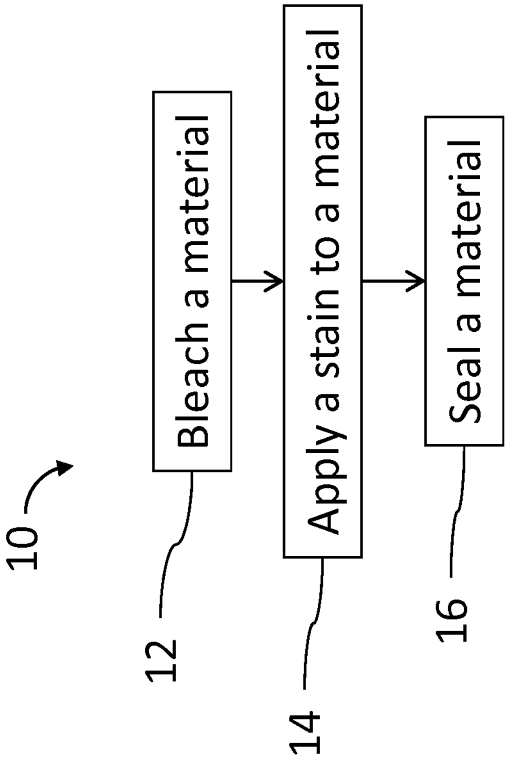
FIG. 1 is a flowchart showing one embodiment of a process for producing an ombré finish for materials.

Referring to FIG. 1 of the drawings, the reference numeral 10 designates generally methods of producing ombré finishes for materials. An ombré finish produces a visual effect by which the color of stain on a material may be graduated from dark at the bottom or side of a surface to progressively lighter at the top, or center of said surface. A material is any material adapted for receiving stain, and may include, by way of nonlimiting example, fibrous materials derived from wood, solid woods, hardwoods, veneers, particle board, plywood, medium-density fiberboard, polymers, resins, and plastics.

Those methods 10 may comprise bleaching a material at step 12, applying a stain to said material at step 14, and sealing said material at step 16. Bleaching a material at step 12 may include application of a bleaching agent to said material, such as, by way of nonlimiting example, chlorine bleach, a solution of about 3-6% sodium hypochlorite (NaClO), or oxygen bleach, which may comprise hydrogen peroxide or a peroxide-releasing compound such as sodium perborate, sodium percarbonate, sodium persulfate, tetrasodium pyrophosphate, or urea peroxide together with catalysts and activators, e.g., tetraacetylethylenediamine and/or sodium nonanoyloxybenzenesulfonate.

In one embodiment, a two-part oxygen bleach may be used to whiten a wood material. A first part of said two-part oxygen bleach may comprise sodium hydroxide, such as, by way of nonlimiting example, Wood Bleach #1 produced by Morgan-Gallacher, Inc. (Santa Fe Springs, Calif.). A second part of said two-part oxygen bleach may comprise hydrogen peroxide, such as, by way of nonlimiting example, Wood Bleach #2 produced by Morgan-Gallacher, Inc. (Santa Fe Springs, Calif.). In one embodiment, about one quart of Wood Bleach #1 may be applied to a wood material using a cotton rag, such that the surface of the wood material is completely wet. Any suitable applicator may be used to apply said bleach, such as, by way of nonlimiting example, rags, rubbing pads, brushes, and spray guns. The wood material may then be allowed to dry for about half an hour. Next, about one quart of Wood Bleach #2 may be applied to the wood material using the same method, and may be allowed to dry for about two hours. Other suitable quantities of bleach may also be used. In one embodiment, the bleaching at step 12 may occur outdoors under direct sunlight, so that the bleaching process is accelerated.

Some darker materials may require more bleaching than some lighter materials. Darker materials may include, by way of nonlimiting example, ribbon stripe mahogany, wenge, and walnut, while lighter materials may include, by way of nonlimiting example, maple, French ash, sycamore, birdseye maple, and oak. In one embodiment, the bleaching at step 12 may be repeated about five times for said darker materials and about three times for said lighter materials. Once the bleaching at step 12 is complete, the bleach on said material may be neutralized through the application of plain white vinegar. In one embodiment, the surface of said material may be saturated with plain white vinegar and allowed to dry for about two hours.

Still referring to FIG. 1, applying stain to a material at step 14 may involve the selection of a suitable stain. A stain may comprise various coloring agents in solution with acetone, ethanol, diethylene glycol monobutyl ether, n-propyl acetate, isopropanol, or acetaldehyde, such as, by way of nonlimiting example, Ultra Penetrating Stain™ produced by RPM Wood Finishes Group, Inc. (Hickory, N.C.). In one embodiment, between about 1.5 oz. and about 1.75 oz. of Ultra Penetrating Stain™ may be combined with about 16 oz. of acetone to create a suitable stain. The color of said stain will depend on the coloring agents present, and any number of colors may be created through combination of various stains. For example, in one embodiment, about 1 oz. of Ultra Penetrating Stain™ (Golden Oak) may be combined with about 0.25 oz. Ultra Penetrating Stain™ (Black), about 0.5 oz. Ultra Penetrating Stain™ (Walnut), and about 16 oz. of acetone to create a suitable stain. Any number of stain colors may be used, such as, by way of nonlimiting example, the following stain colors manufactured by RPM Wood Finishes Group, Inc. (Hickory, N.C.): Raw Umber, Burnt Umber, Van Dyke Brown, Yellow, Lemon Yellow, Mustard, Light Red Mahogany, Black, Dark Red Mahogany, Brown Mahogany, Brown Maple, Orange, Colonial Maple, Red, Oxblood, Perfect Brown, Modern Mahogany, Medium Mahogany, Cherry, Green, Blue, Burnt Sienna, and Raw Sienna.

Any suitable applicator may be used to apply said stain, such as, by way of nonlimiting example, rags, rubbing pads, brushes, and spray guns. In one embodiment, stain may be added to a DeVilbiss™ High Volume Low Pressure ("HVLP") spray gun manufactured by DeVilbiss Air Power Company (Jackson, Tenn.). If the air pressure supplied to the spray gun is too great, the stain may excessively soak the material, and if the air pressure is too little, the stain may form spotty or blotchy patches on the material. In one embodiment, a suitable air pressure supplied to a spray gun may be between about 60 psi and about 70 psi.

In some embodiments of methods at step 14, stain may be applied in greater concentration at a first end of a surface of a material and in lesser concentration at a second end of said surface of said material. The concentration of stain applied from a spray gun may depend on the number of spray passes, the distance of the nozzle from the surface of the material, the size of the nozzle aperture, or any combination thereof. In one embodiment, a spray gun may pass (1) said first end about nine times at a distance of about 1 ft. from said surface, (2) said second end about three times at a distance of about 2 ft. from said surface, and (3) an intermediate point between said first end and said second end about six times at a distance of about 1.5 ft. Said stain may be blended from said first end to said second end using additional passes to create a gradual transition in concentration and to eliminate any lines of uneven color that may appear. In one embodiment, said spray passes may be applied using generally horizontal strokes from said first end to said second end. During the application process of step 14, a cotton rag containing a suitable solvent such as, for example, naptha, may be used to clear away excess stain from the surface of the material in order to examine the staining pattern on said surface.

In another embodiment of application step 14, stain may be applied in a generally uniform manner over the surface of a material and then selectively removed to produce an ombré finish. One embodiment of application step 14 may comprise applying stain in a generally uniform manner over the surface of a material from a first end to a second end of said material and then gradually removing said stain from said second end to said first end of said material.

Referring again to FIG. 1, a sealing step 16 may involve the application of a varnish to the surface of a material. A "sealed" surface is a surface to which varnish has been applied. In one embodiment, said varnish may be a solvent-based lacquer comprising a thinning agent such as, by way of nonlimiting example, butyl acetate, xylene or toluene. In one embodiment, the varnish may include Chemlack™ 275—GLOSS produced by Chemcraft Coating Technology, Inc. (Chico, Calif.), which may comprise acetone, chlorobenzotrifluorides, ethylene glycol monobutyl ether, and isopropanol. Any suitable applicator may be used to apply said varnish, such as, by way of nonlimiting example, rags, rubbing pads, brushes, and spray guns. In another embodiment of the sealing step 16, varnish may be sprayed over the surface of a material using even strokes, such that said varnish is distributed uniformly over said surface. In yet another embodiment, the varnish applied in sealing step 16 may include a solvent-based lacquer which is capable of drying in about 15 minutes.

Figure 2:
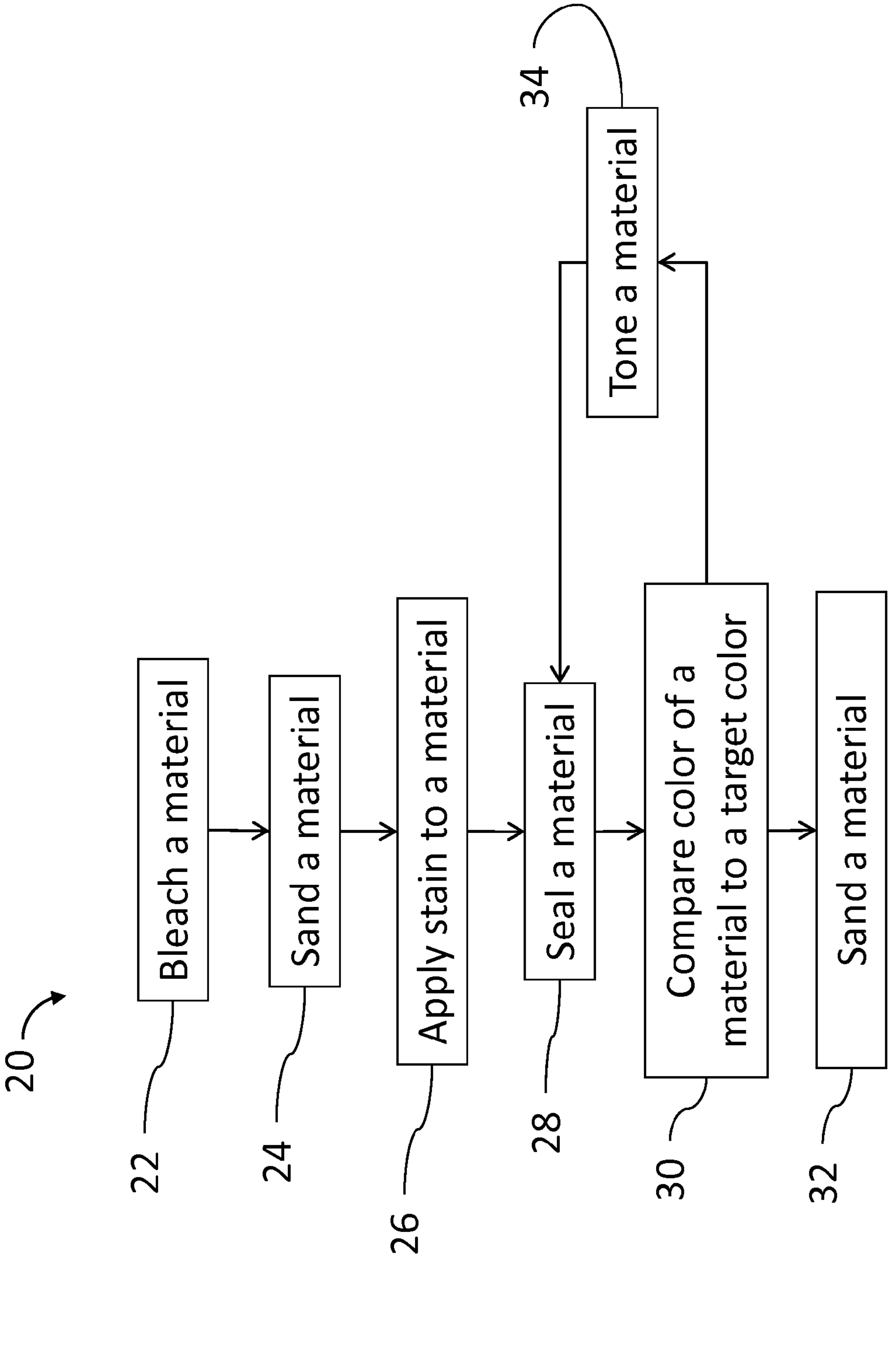
FIG. 2 is a flowchart showing one embodiment of a process for producing an ombré finish for materials, which comprises an optional toning step.

Turning now to FIG. 2, the reference numeral 20 designates generally methods of producing ombré finishes for materials which comprise an optional toning step 34. Those methods comprise bleaching a material at step 22, applying a stain to said material at step 26, and sealing said material at step 28, as described above in reference to FIG. 1. In one embodiment, the color of a material may be compared to a target color at step 30 to determine whether additional staining via optional toning step 34 is needed. Toning step 34 may involve the application of a stain to the surface of a material that has been sealed by one or more sealing steps 28. While the procedures for toning step 34 may be identical to those of the application step 26, the stain in toning step 34 may not penetrate as far into the body of the material as the stain in application step 26, due to the presence of varnish from one or more sealing steps 28. In one embodiment, the toning in step 34, sealing in step 28, and comparing step 30 may be repeated until the color of said material matches said target color.

Referring again to FIG. 2, one or more sanding steps 24, 32 may involve the removal of material from the surface of a material. In one embodiment, very fine sandpaper having an FEPA designation of P320 and an average abrasive particle diameter of 46.2 μm may be used to sand said surface. In another embodiment, sanding strokes are applied in the direction of the grain within said material such that visual sanding marks are minimized and said surface appears uniformly smooth.

Although the foregoing specific details describe certain embodiments of this invention, persons reasonably skilled in the art will recognize that various changes may be made in the details of this invention without departing from the spirit and scope of the invention as defined in the appended claims and considering the doctrine of equivalents. Therefore, it should be understood that this invention is not to be limited to the specific details shown and described herein.

What is claimed is:

1. A method for producing an ombré finish for a material having a visual effect by which the color of a stain on said material is graduated from dark at the bottom or side of a surface to a progressively lighter color at the top or center of said surface, comprising:

applying a first stain uniformly to a surface of said material in a first darker color concentration toward a first end at said bottom or side of said surface and applying said first stain in a second lighter color concentration toward a spaced apart second end at said top or center of said surface;

blending said first stain from said first end to said second end to create a gradual progressive transition in color concentration from a darker color at said first end to a lighter color at said second end and to eliminate any lines of uneven color; and sealing said surface;

wherein said material comprises fibrous materials derived from wood, solid woods, hardwoods, veneers, particle board, plywood, or medium-density fiberboard.

2. The method of claim 1 further comprising bleaching said surface before said applying step.

3. The method of claim 2 further comprising sanding said material after said bleaching step.

4. The method of claim 1 further comprising sanding said material after said sealing step.

5. The method of claim 1 wherein said material comprises a wood veneer derived from maple, French ash, sycamore, birdseye maple, or oak.

6. The method of claim 1 wherein said first stain is applied using a spray gun.

7. The method of claim 6 wherein air is supplied to said spray gun at a pressure between about 60 psi and about 70 psi.

8. The method of claim 6 further comprising;

Spraying said first stain toward said first end about nine times at a distance of about 1 ft. from said surface;

Spraying said first stain toward said second end about three times at a distance of about 2 ft. from said surface; and Spraying said first stain toward an intermediate point between said first end and said second part about six times at a distance of about 1.5 ft.

9. The method of claim 1 further comprising comparing the color of said material to a target color; and toning said material until said color of said material matches said target color.

10. The method of claim 9 further comprising sealing said surface after said toning step.

11. The method of claim 9 further comprising bleaching said surface before said applying step.

12. The method of claim 11 further comprising sanding said material after said bleaching step.

13. The method of claim 9 further comprising sanding said material after said sealing.

14. The method of claim 9 wherein said material comprises a wood veneer derived from maple, French ash, sycamore, birdseye maple, or oak.

15. The method of claim 9 wherein said first stain is applied using a spray gun.

16. The method of claim 15 wherein air is supplied to said spray gun at a pressure between about 60 psi and about 70 psi.

17. The method of claim 15 further comprising;

Spraying said first stain toward said first end about nine times at a distance of about 1 ft. from said surface;

Spraying said first stain toward said second end about three times at a distance of about 2 ft. from said surface; and Spraying said first stain toward an intermediate point between said first end and said second end about six times at a distance of about 1.5 ft.

18. A method for producing an ombré finish for a material having a visual effect by which the color of a stain on said material is graduated from dark at the bottom or side of a surface to a progressively lighter color at the top or center of said surface, comprising:

applying a single stain substantially uniformly to said surface of said material;

removing a portion of said stain from said surface so as to create a gradual, progressive transition in color concentration of said stain from a first darker color at a first end at said bottom or side of said surface to a second lighter color at a second end at said top or center of said surface and to eliminate any lines of uneven color; and sealing said surface;

wherein said material comprises fibrous materials derived from wood, solid woods, hardwoods, veneers, particle board, plywood, or medium-density fiberboard.

19. The method of claim 18 further comprising bleaching said surface before said applying step.

* * * * *